(12) United States Patent
Taniguchi et al.

(10) Patent No.: US 10,483,425 B2
(45) Date of Patent: Nov. 19, 2019

(54) OPTICAL SEMICONDUCTOR COMPONENT PACKAGE AND OPTICAL SEMICONDUCTOR DEVICE

(71) Applicant: KYOCERA Corporation, Kyoto-shi, Kyoto (JP)

(72) Inventors: Masahiko Taniguchi, Kirishima (JP); Hidenobu Egashira, Kirishima (JP)

(73) Assignee: Kyocera Corporation, Kyoto (JP)

( * ) Notice: Subject to any disclaimer, the term of this patent is extended or adjusted under 35 U.S.C. 154(b) by 57 days.

(21) Appl. No.: 15/760,947

(22) PCT Filed: Oct. 25, 2016

(86) PCT No.: PCT/JP2016/081522
§ 371 (c)(1),
(2) Date: Mar. 16, 2018

(87) PCT Pub. No.: WO2017/073538
PCT Pub. Date: May 4, 2017

(65) Prior Publication Data
US 2018/0261714 A1    Sep. 13, 2018

(30) Foreign Application Priority Data
Oct. 30, 2015 (JP) .................. 2015-213609

(51) Int. Cl.
*H01L 31/173* (2006.01)
*H01S 3/067* (2006.01)
(Continued)

(52) U.S. Cl.
CPC ........ *H01L 31/173* (2013.01); *H01L 31/0203* (2013.01); *H01L 31/024* (2013.01);
(Continued)

(58) Field of Classification Search
CPC ..... H01L 33/483; H01L 33/486; H01L 33/48; H01L 31/173; H01S 5/0601; H01S 5/0609; H01S 3/06704
See application file for complete search history.

(56) References Cited

U.S. PATENT DOCUMENTS 6,520,652 B1 * 2/2003 Huang ............... G02B 27/0018
                                                        359/601
9,130,109 B2 * 9/2015 Makimura ........ H01L 31/02164

FOREIGN PATENT DOCUMENTS

JP    11-074569 A    3/1999
JP    2001-052364 A    2/2001
(Continued)

OTHER PUBLICATIONS

International Search Report, PCT/JP2016/081522, dated Dec. 27, 2016, 2 pgs.

*Primary Examiner* — Jose R Diaz
(74) *Attorney, Agent, or Firm* — Volpe and Koenig, P.C.

(57) ABSTRACT

An optical semiconductor component package includes a base, a frame, a lid, and a light absorbing member located on an inner surface of the lid. The base is plate-like and has a first surface including a mount area in which an optical semiconductor component is mountable. The frame is located on the first surface and surrounds the mount area. The lid is plate-like and is bonded to the frame and covers the mount area. The light absorbing member is located on a second surface of the lid facing the mount area, and has a plurality of recesses on its surface.

12 Claims, 6 Drawing Sheets

(51) Int. Cl.
*H01S 5/022* (2006.01)
*H01L 33/48* (2010.01)
*H01S 5/06* (2006.01)
*H01L 31/02* (2006.01)
*H01L 31/0203* (2014.01)
*H01L 31/024* (2014.01)
*H01L 33/60* (2010.01)
*H01L 33/62* (2010.01)
*H01L 33/64* (2010.01)
*H01S 5/024* (2006.01)

(52) U.S. Cl.
CPC ...... *H01L 31/02005* (2013.01); *H01L 33/486* (2013.01); *H01L 33/60* (2013.01); *H01L 33/62* (2013.01); *H01L 33/645* (2013.01); *H01S 3/06704* (2013.01); *H01S 5/022* (2013.01); *H01S 5/02216* (2013.01); *H01S 5/0601* (2013.01); *H01S 5/0609* (2013.01); *H01L 33/48* (2013.01); *H01S 5/02248* (2013.01); *H01S 5/02276* (2013.01); *H01S 5/02284* (2013.01); *H01S 5/02415* (2013.01)

(56) References Cited

FOREIGN PATENT DOCUMENTS

| | | |
|---|---|---|
| JP | 2002-026439 A | 1/2002 |
| JP | 2003-209315 A | 7/2003 |

\* cited by examiner

FIG. 4A
FIG. 4B
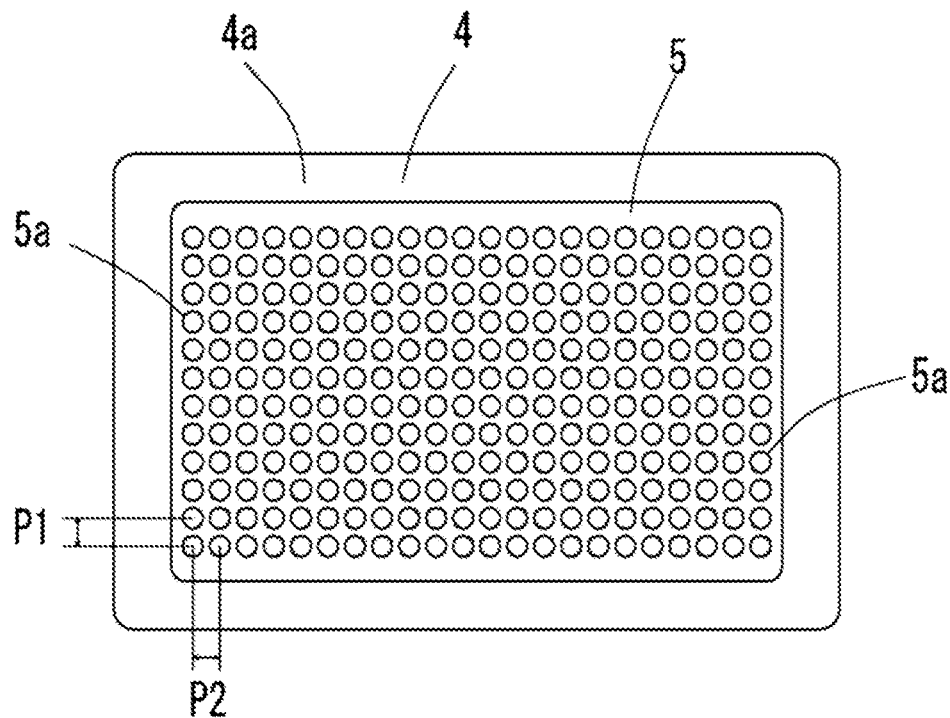
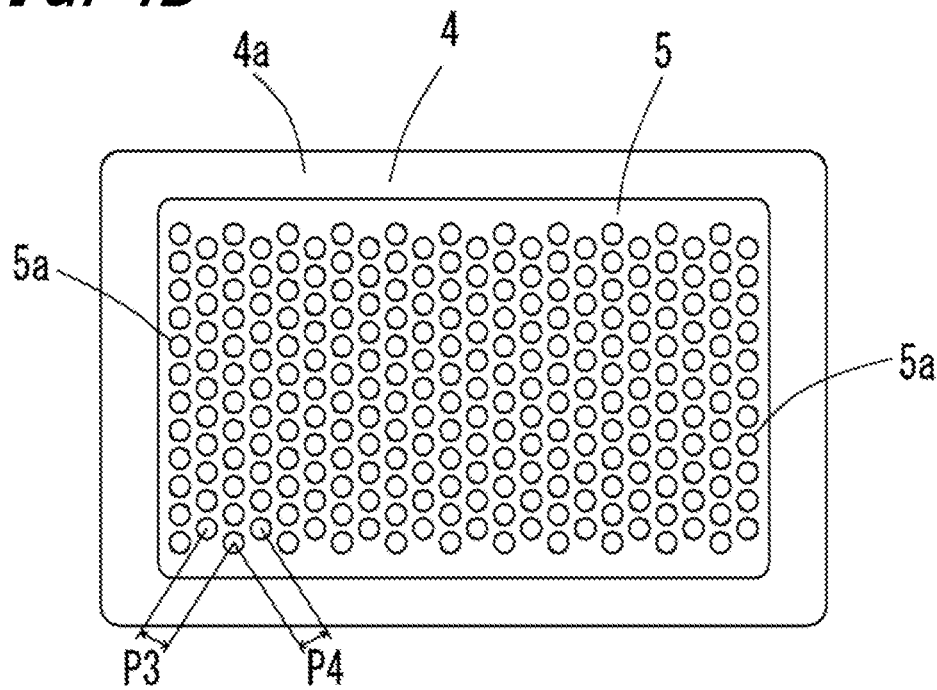

OPTICAL SEMICONDUCTOR COMPONENT PACKAGE AND OPTICAL SEMICONDUCTOR DEVICE

FIELD

The present invention relates to an optical semiconductor component package for containing an optical semiconductor component, and an optical semiconductor device.

BACKGROUND

An optical semiconductor component, typically a laser diode (LD) or a photodiode (PD), is contained in an optical semiconductor component package for both protection and for electrical connection to an external signal wire, or for optical connection to an external optical fiber. Light emitted from the optical semiconductor component may be unintendedly reflected by, for example, members in the optical semiconductor component package, and the reflected light may be received by a light-receiving element as stray light.

A semiconductor light-emitting element described in Japanese Patent Application Publication No. 2002-26439 includes a semiconductor light chip mounting base with a rough front surface, which is coated with a light absorbing film to reduce stray light resulting from its return light. The semiconductor light-emitting element described in Japanese Patent Application Publication No. 2002-26439 has the relatively small front surface of the base to reduce stray light, and may not reduce stray light unless light returns to the front of the base.

BRIEF SUMMARY

An optical semiconductor component package according to one aspect of the present invention includes a base, a frame, a lid, and a light absorbing member. The base is plate-like and has a first surface including a mount area in which an optical semiconductor component is mountable. The frame is located on the first surface and surrounds the mount area. The lid is plate-like and is bonded to the frame and covers the mount area. The light absorbing member is located on a second surface of the lid facing the mount area and has a plurality of recesses on its surface.

An optical semiconductor device according to one aspect of the present invention includes the above optical semiconductor component package and an optical semiconductor component mounted in the mount area.

BRIEF DESCRIPTION OF DRAWINGS

FIGS. 4A and 4B are plan views of the light absorbing member 5 describing the arrays of recesses 5a on its surface.

DETAILED DESCRIPTION

Figure 1:
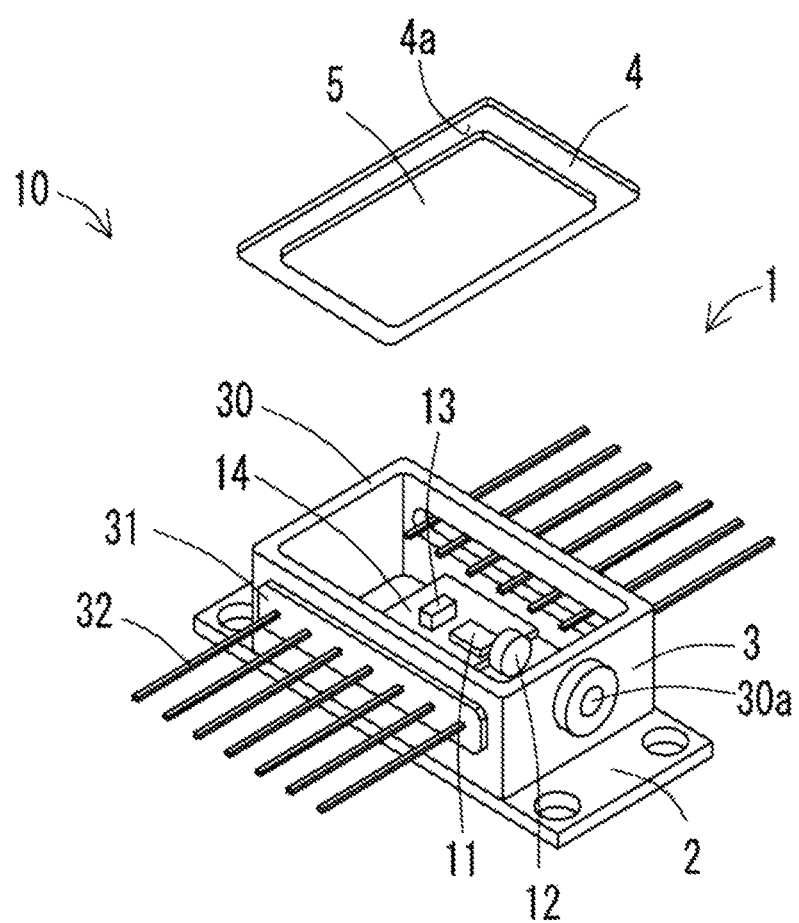
FIG. 1 is a schematic view of an optical semiconductor device 10 including an optical semiconductor component package 1 according to one embodiment of the present invention.
Figure 2A:
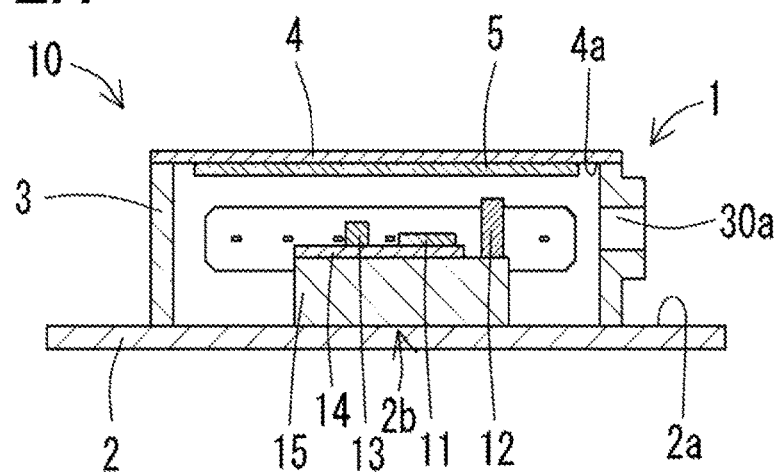
FIGS. 2A and 2B are cross-sectional views of the optical semiconductor device 10.
Figure 2B:
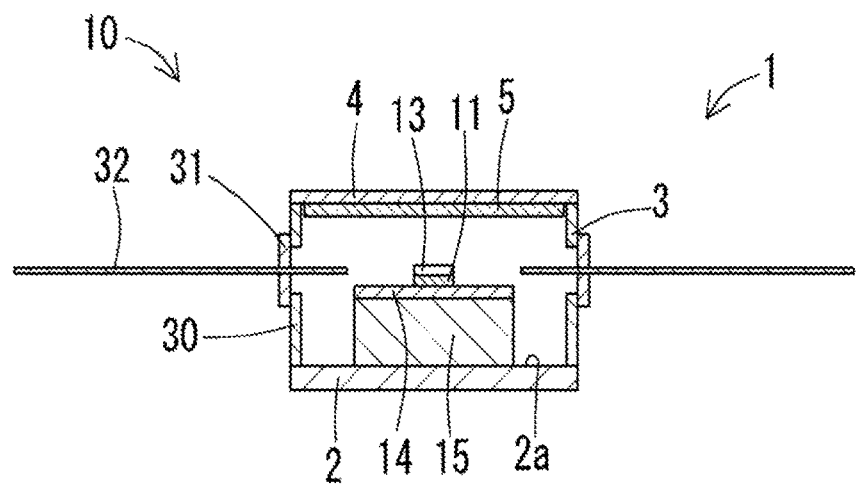

FIG. 1 is a schematic view of an optical semiconductor device 10 including an optical semiconductor component package 1 according to one embodiment of the present invention. FIGS. 2A and 2B are cross-sectional views of the optical semiconductor device 10.

The optical semiconductor component package 1 includes a base 2, a frame 3, a lid 4, and a light absorbing member 5. The optical semiconductor component package 1 contains an optical semiconductor component 11. The optical semiconductor component package 1 is incorporated in an optical semiconductor device 10 capable of photoelectric conversion. In the present embodiment, the optical semiconductor component 11 contained in the optical semiconductor component package 1 is a laser diode (LD), which is a light-emitting element.

The base 2 is a rectangular plate having a mount area 2b on a first surface 2a, in which the optical semiconductor component 11 is mountable. The mount area 2b is used for mounting the optical semiconductor component 11 to be contained in the optical semiconductor component package 1, and for fixing the optical semiconductor component 11 to the surface of the base 2.

In the present embodiment, the base 2 may be prepared by stacking multiple insulating substrates. The optical semiconductor component 11 is mounted in the mount area 2b of the base 2. For example, the insulating substrate may be formed from a ceramic material, such as sintered aluminum oxide, sintered mullite, sintered silicon carbide, sintered aluminum nitride, or sintered silicon nitride, or a glass ceramic material.

One method for preparing the base 2 will now be described. Raw material powder containing the ceramic powder of the above materials, or both of the glass powder and the ceramic powder, an organic solvent, and a binder are mixed to form a mixture. The mixture is then shaped into a sheet to obtain a ceramic green sheet. Multiple ceramic green sheets prepared in this manner are stacked on one another into a laminate, which is then fired at about 1600° C. to complete the base 2.

The base 2 may not be the laminate of multiple insulating substrates. The base 2 may be a single insulating substrate. To have high insulation at least in the mount area 2b in which the optical semiconductor component 11 is mountable, the base 2 may include an insulating substrate at least in the mount area 2b of a metal substrate. This structure, including the metal material with high heat dissipation is used particularly when high heat dissipation is intended for the base 2. The base 2 including the insulating substrate on the metal substrate can have high heat dissipation while insulating the metal substrate from the optical semiconductor component 11. In some embodiments, a Peltier device may replace the insulating substrate or may be mounted on the insulating substrate.

Examples of the materials for the metal substrate include metals such as iron, copper, nickel, chromium, cobalt, molybdenum, and tungsten, and alloys of these metals such as a copper-tungsten alloy, a copper-molybdenum alloy, and an iron-nickel-cobalt alloy. A metal substrate for the base 2 may be prepared by processing an ingot made of such a metal material by, for example, rolling or punching. The metal substrate then has its mount area 2b in which, for example, a separately prepared insulating substrate or Peltier device may be bonded with a bond, such as brazing material or solder, to obtain the base 2.

The frame 3 includes a rectangular frame body 30, dielectric layers 31 formed from a ceramic material and arranged on the facing sidewalls of the frame body 30, and connection terminals 32 for electrical connection to the optical semiconductor component 11. The frame body 30 is located on the first surface 2a of the base 2 and surrounds the mount area 2b of the base 2 when viewed from a position perpendicular to the first surface 2a of the base 2. The frame body 30 may simply surround the mount area 2b. The mount area 2b may be arranged at a center or in any other area inside the frame body 30. The base 2 may have the first surface larger than and extending from the frame body 30 as described in the present embodiment, or may have substantially the same outer profile as the frame body 30.

The frame body 30 is formed from a metal material, such as iron, copper, nickel, chromium, cobalt, or tungsten, or an alloy of these metals, in the same manner as the base 2. The frame body 30 formed from such a metal material may be prepared by processing an ingot made of the metal material by, for example, cutting, die machining, or punching. In some embodiments, the frame body 30 may be formed from a ceramic material. The frame body 30 may be formed from a single material, or from two or more different materials stacked on one another.

In the present embodiment, the optical semiconductor component 11 is used. Thus, the frame body 30 has a through-hole 30a for light to pass through. Optical signals emitted from the optical semiconductor component 11 pass through the through-hole 30a and output from the optical semiconductor device 10. In some embodiments, the input end of an optical fiber may be inserted in the through-hole 30a to receive light emitted from the optical semiconductor component 11. The input end of the optical fiber may also be fixed at the exit of the through-hole 30a to receive light emitted from the optical semiconductor component 11 and passing through the through-hole 30a out of the frame body 30.

The frame body 30 has sidewalls each having a slot. The dielectric layers 31 are attached to the sidewalls of the frame body 30 to cover the slots. Each dielectric layer 31 may be a single layer, or may be a laminate of multiple layers stacked on one another. Connection terminals 32 are arranged through the dielectric layers 31 to allow input or output of electric signals through the frame body 30.

Each connection terminal 32 has a first end located within the frame, and electrically connected to, for example, the optical semiconductor component 11 mounted in the mount area 2b of the base 2 or to other electronic parts within the frame. Each connection terminal 32 has a second end located outside the frame, and electrically connected to, for example, an external mounting board. The connection terminals 32 may not be arranged in a single layer of the dielectric layer 31 through the dielectric layer 31, and may be arranged across multiple layers using a layered connection conductor, such as a via-conductor.

The dielectric layer 31 may be formed from the same ceramic material as described for the insulating substrate for the base 2. The connection terminals 32 are formed from a metal material, such as gold, silver, copper, nickel, tungsten, molybdenum, or manganese. The connection terminals 32 may be formed on the surface layer or an inner layer of the dielectric layer 31 as a metallization layer or a plating layer formed by firing together or metal plating. The connection terminals 32 may also be lead terminals connected outside the frame. Each lead terminal is a wire rod of a metal material processed into a predetermined shape. The lead terminals may be connected to a plating layer on the surface layer of the dielectric layer 31 using a bond, such as a brazing material.

The connection terminals 32 may not be the metallization layer formed from a metal material that can be fired together with the dielectric layer 31 or the plating layer applied on the metallization layer, and may be a metal alloy of at least two of iron, nickel, cobalt, and chromium, which is processed into a predetermined shape of lead terminals. The lead terminals serving as the connection terminals 32 are bonded to the plating layer applied on the metallization layer on the surface layer of the dielectric layer 31.

The dielectric layer 31 formed from, for example, sintered aluminum oxide may be prepared in the manner described below. First, raw material powder of aluminum oxide is formed into a sheet with an appropriate organic binder and an appropriate organic solvent to obtain a rectangular ceramic green sheet. Multiple green sheets prepared in this manner are stacked on one another into a laminate, which is then fired at about 1600° C. This completes the dielectric layer 31. The dielectric layer 31 may not be a laminate of multiple ceramic green sheets stacked on one another. The dielectric layer 31 may be a single ceramic green sheet that provides sufficiently high mechanical strength for the dielectric layer 31.

The dielectric layer 31 formed from sintered aluminum oxide, the connection terminals 32 contain, for example, tungsten, and may be prepared in the manner described below. A metal paste prepared by mixing tungsten powder with an organic solvent and an organic binder is printed by, for example, screen printing to form a predetermined pattern on a surface (a first surface) of the ceramic green sheet to be the dielectric layer 31. The ceramic green sheet and the metal paste are then fired together to form the connection terminals 32.

To prepare the connection terminals 32 containing an interlayer connection conductor, the same metal material and the same method as described above may be used. For the interlayer connection conductor, through-holes extending in the thickness direction are formed in advance in the ceramic green sheets to be the dielectric layer 31. The metal paste is filled into the through-holes, and then the ceramic green sheets and the metal paste are fired together.

The optical semiconductor component 11 and the connection terminals 32 may be connected in any manner that allows transmission of electric signals. For example, the optical semiconductor component 11 and the connection terminals 32 located in the frame body 30 may be electrically connected to a wiring conductor arranged on a wiring board 14 with an electrical connector (not shown), such as a bonding wire, flip chip, or an anisotropically conductive film (ACF).

The lid 4 is bonded to and fixed to an upper surface of the frame body 30 with a bond, such as solder. The optical semiconductor device 10 may be assembled by mounting and fixing the optical semiconductor component 11 on the wiring board 14 arranged in the mount area 2b of the base 2 with a mount member 15 placed between the wiring board 14 and the base 2. The optical semiconductor component 11 is then electrically connected to the connection terminals 32 through the wiring board 14. An optical fiber is then fixed at the through-hole 30a to allow optical signals to travel between the fiber and the optical semiconductor component 11. The lid 4 is then bonded to and fixed to the frame body 30. The lid 4 may also be bonded to and fixed to the frame body 30 by, for example, seam welding.

The lid 4 may be any member that prevents moisture or fine particles from entering the optical semiconductor device 10. The lid 4 may be formed from, for example, the same metal material as for the frame body 30 or the same ceramic material as for the dielectric layer 31, and may be shaped into a plate.

The optical semiconductor component 11 is to be aligned with the optical axis of the optical fiber. Thus, the optical semiconductor component 11 is not mounted directly on the base 2, and the mount member 15 is fixed onto the mount area 2b of the base 2. The optical semiconductor component 11 may be mounted on the wiring board 14 arranged on a third surface of the mount member 15 for electrical connection. The mount member 15 may be an insulating material or a metal material. For example, the same ceramic material as for the insulating substrate, or the same metal material as for the metal substrate as described for the base 2, or Peltier device may be used.

When a light-emitting element is used as the optical semiconductor component 11 as in the present embodiment, the light-receiving element 13 for monitoring light emitted from the light-emitting element is also electrically connected to the wiring board 14 in the same manner as the optical semiconductor component 11, and is also contained in the optical semiconductor component package 1. An optical member 12, such as an optical lens, for collecting light emitted from the light-emitting element, and inputting light to the optical fiber is also contained in the optical semiconductor component package 1.

The light-emitting element reflects light generated inside at its one end face, and emits the light from the other opposite end face in a specific direction. The light is partially transmitted through the end face for reflecting light to emit light in the direction opposite to the light emitting direction. This partial light is received by the light-receiving element 13. Light emitted from the light-emitting element is thus monitored. The light-emitting element, or the optical semiconductor component 11, the light-receiving element 13 and the optical member 12, are arranged on the optical axis of light emitted from the optical semiconductor component 11. The light-receiving element 13 is arranged opposite to the optical member 12 from the optical semiconductor component 11.

The light-receiving element 13 outputs electric signals in response to receiving light emitted from the light-emitting element. The electric signals pass through the wiring board 14, an electric connection member, and the connection terminals 32 to be output from the optical semiconductor component package 1 as monitoring signals. An external control unit monitors the performance of the light-emitting element based on the monitoring signals, and adjusts, for example, the current value to be provided to the light-emitting element as appropriate. In the present embodiment, the optical semiconductor component 11 and the light-receiving element 13 are mounted on the wiring board 14 on the mount member 15 with the electric connection member, such as solder or a bonding wire, as described above. The connection terminals 32 and the optical semiconductor component 11, or the connection terminals 32 and the light-receiving element 13 may be electrically connected directly to one another, or may be indirectly connected through the wiring board 14.

Light emitted from the light-emitting element may be partially reflected on the surface of the optical member 12, or light that has passed through the optical member 12 may be partially reflected on the surface of the input end of the optical fiber to become stray light. This stray light is repeatedly reflected on, for example, the inner surfaces of the frame body 30, the inner surface of the lid 4, and the first surface 2a of the base 2, and may then enter the light-receiving element 13. If the light-receiving element 13 receives unintended light, or light not directly emitted from the light-emitting element, an erroneous signal component from such erroneous light can be superimposed on monitoring signals, which are to be output from the light-receiving element 13. This may then cause an erroneous operation of the light-emitting element controlled using the monitoring signals.

The optical semiconductor component package 1 according to the present embodiment includes the light absorbing member 5 arranged on a flat inner surface 4a of the lid 4, or the flat surface facing the mount area 2b of the lid 4. The light absorbing member 5 absorbs stray light traveling toward the lid 4 after repeatedly reflected on, for example, the surface of the optical member 12, the surface of the input end of the optical fiber, the inner surfaces of the frame body 30, and the first surface 2a of the base 2. The lid 4 in the present embodiment can thus reduce stray light in the optical semiconductor component package 1. This structure reduces light that may be erroneously received by the light-receiving element 13 and may cause noise, and thus reduces an erroneous operation of the optical semiconductor component 11 during the operation of the optical semiconductor device 10.

The light absorbing member 5 is to be provided across the largest possible area of the inner surface 4a (the second surface) of the lid 4 to absorb more stray light. The light absorbing member 5 is to be thinner not to reduce the internal space of the optical semiconductor component package 1. The light absorbing member 5 may thus be provided as a layer on the inner surface 4a of the lid 4. The light absorbing member 5 provided as a layer has a plurality of recesses 5a on its surface.

The light absorbing member 5 may have a layer thickness of 0.01 to 1 mm to effectively absorb stray light traveling toward the lid 4, although this range may differ depending on the light absorption of the material used for the light absorbing member 5. The light absorbing member having a layer thickness of 0.01 mm or less is so thin that may allow stray light to pass through, and may not have the intended light absorbing ability. The light absorbing member 5 having a layer thickness of 1 mm or more reduces the internal space of the optical semiconductor component package 1, thus disabling the optical semiconductor device 10 from becoming smaller. Further, the light absorbing member 5 having a large thickness may have greater thermal stress caused by the different thermal expansion coefficients of the lid 4 and the light absorbing member 5, and may thus deform, crack, or delaminate, possibly lowering the sealing performance and the stray light absorbing performance of the lid 4.

Figure 3:
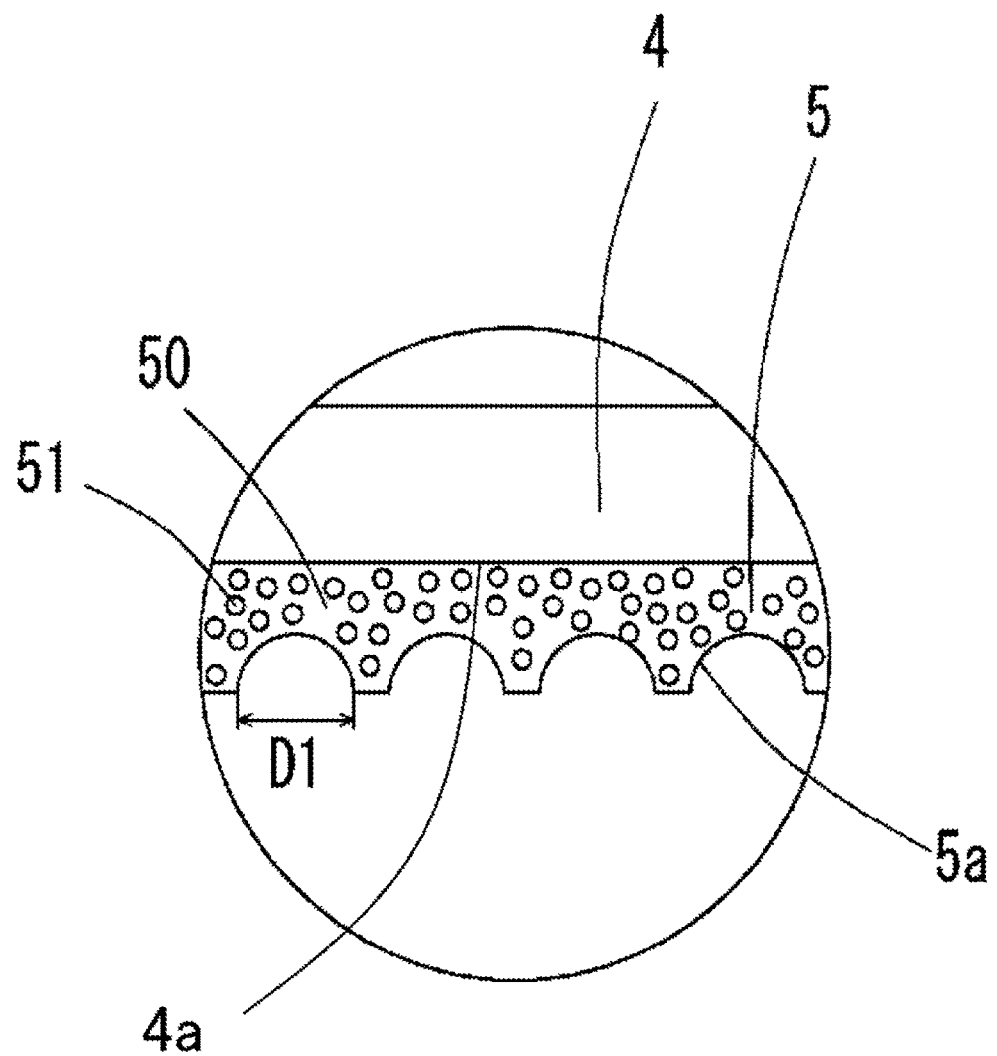
FIG. 3 is a partially enlarged schematic cross-sectional view of a lid 4 and a light absorbing member 5.

FIG. 3 is a partially enlarged schematic cross-sectional view of the lid 4 and the light absorbing member 5. The light absorbing member 5 includes an absorbing member body 50, and light absorbers 51 dispersed in the absorbing member body 50. The absorbing member body 50 is formed from, for example, an inorganic material such as glass, or an organic material such as light transmissive resin.

The absorbing member body 50 formed from an inorganic material such as glass may carry the light absorbers 51 either on its surface or inside. The absorbing member body 50 may transmit stray light to allow the stray light to reach the dispersed black inorganic pigments 51. Further, the absorbing member body 50 may be formed from a material that has its properties including the transmittance of light from the light-emitting element unchanged by an increase in temperature during manufacture and during the operation of the optical semiconductor device 10. Examples of the glass material formed from such an inorganic material include borate glasses (e.g., $B_2O_3$, $Li_2O$—$B_2O_3$, and $Na_2O$—$B_2O_3$), phosphate glass (e.g., $Na_2O$—$P_2O_5$ and $B_2O_3$—$P_2O_5$), tin phosphate zinc glass (e.g., $P_2O_5$—SnO—ZnO), borosilicate glass (e.g., $SiO_2$—$B_2O_3$, $SiO_2$—$B_2O_3$—$Al_2O_3$, $SiO_2$—$B_2O_3$—$Li_2O$, $SiO_2$—$B_2O_3$—$Na_2O$, and $SiO_2$—$B_2O_3$—BaO—$Na_2O$), and other glasses such as $SiO_2$—BaO—ZnO, BaO—$B_2O_3$—ZnO, and $Bi_2O_3$—$B_2O_3$—$SiO_2$ based glasses. Of these, $SiO_2$—BaO—ZnO based glass materials may be used.

The absorbing member body 50 formed from an organic material, such as resin, may carry the light absorbers 51 on its surface or inside in the same manner as for the glass material. The absorbing member body 50 may be formed from a material that has its properties including the transmittance of light from the light-emitting element unchanged by an increase in temperature during manufacture and during the operation of the optical semiconductor device 10. Examples of the material include silicone resin, epoxy resin, and acrylic resin.

The light absorbers 51 may be formed from any material that can be dispersed in the material forming the absorbing member body 50 and can absorb light emitted from the light-emitting element, which may become stray light. The absorbing member body 50 either formed from an organic material or an inorganic material, such as glass, may contain particles of black inorganic pigments as the light absorbers 51.

Examples of the black inorganic pigments include carbon pigments such as carbon black, nitride pigments such as titanium black, and metal oxide pigments such as Cr—Fe—Co, Cu—Co—Mn, Fe—Co—Mn, and Fe—Co—Ni—Cr pigments. Of these, Cr—Fe—Co pigments, or specifically, $Cr_2O_3$—FeO—CoO pigments may be used. The black inorganic pigments are particulate, and may have an average particle diameter of 10 to 200 nm, or preferably 10 to 100 nm.

When the absorbing member body 50 is formed from an organic material, the organic material may partially decompose into gas, or the organic material may contain a low boiling point component that may gasify with Joule's heat generated during the operation of the semiconductor element. The resulting gaseous component may touch the optical semiconductor component 11, the light-receiving element 13, or the optical member 12 to change and degrade their properties including optical transmittance, thus lowering the optical coupling efficiency between the optical semiconductor component 11 and the optical fiber through the optical member 12, or an erroneous operation of the optical semiconductor component 11 and the light-receiving element 13. Thus, the absorbing member body 50 and the light absorbers 51 generating no gas may be formed from an inorganic material to generate no gas. For example, the light absorbing member 5 may be formed from the glass and the black inorganic pigments as described above.

The light absorbing member 5 as a layer has the plurality of recesses 5a on its surface. Thus, the surface that receives stray light traveling toward the lid 4 includes the inner peripheries of the recesses 5a and the flat surfaces excluding the recesses 5a. Stray light may be incident on any angle. The angle at which stray light entering through the surface of the light absorbing member 5 is unpredictable. Stray light incident on the inner surfaces of the recesses 5a partially travels into the light absorbing member 5, and is partially reflected. Light traveling into the light absorbing member 5 reaches and is absorbed by the light absorbers 51 in the light absorbing member 5.

Light reflected on the inner periphery of one recess 5a may be incident on a different part of the inner periphery of the same recess 5a. In other words, stray light partially reflected on the inner periphery of the recess 5a reaches the inner periphery of the recess 5a and enters and travels into the light absorbing member 5, and then reaches and is absorbed by the light absorbers 51 in the absorbing member 5. The recesses 5a on the surface of the light absorbing member 5 allow more stray light to enter the light absorbing member 5 through the recesses 5a and is absorbed by the light absorbers 51. The lid 4 with this structure thus increases stray light to be absorbed by the light absorbing member 5. In this manner, stray light entering the recesses 5a is more likely to be absorbed by the light absorbers 51.

The optical semiconductor device 10 can thus efficiently reduce stray light inside the optical semiconductor component package 1. Thus, the optical semiconductor component package 1 and the optical semiconductor device 10 have high operation reliability and long-term reliability.

FIGS. 4A and 4B are plan views of the light absorbing member 5 describing the inner surface 4a of the lid 4 when viewed from a position perpendicular to the inner surface 4a (the second surface), showing the arrays of recesses 5a on the surface of the light absorbing member 5. FIG. 4A shows recesses 5a arranged in a rectangular grid. FIG. 4B shows recesses 5a arranged in a rhombic grid.

The recesses 5a may have triangular, rectangular, polygonal, or circular (including elliptical) openings, and may particularly have circular or elliptical openings. Stray light is incident on the surface of the light absorbing member 5 in any direction. The angle at which stray light is incident on the surface of the light absorbing member 5 is unpredictable. A circular opening allows stray light in any direction to be incident on the inner periphery of each recess 5a in the same manner. This eliminates variations in the amount of stray light absorbed by the light absorbing member 5 depending on the incident direction. The lid 4 thus absorbs stray light in a stable manner.

Further, circular or elliptical openings have no corners on the inner surfaces. These openings can prevent thermal stress due to the different thermal expansion coefficients of the lid 4 and the light absorbing member 5 from concentrating on part of the inner surfaces of the recesses 5a. Thus, the circular or elliptical openings can reduce cracks in the light absorbing member 5 caused by thermal stress concentrated on part of the recesses 5a.

The recesses 5a with circular openings each have a circular opening diameter D1 of, for example, 0.2 to 1 mm. The total area S of the openings of the recesses 5a is written as S=s×n, where s is the area of the opening of each recess 5a, and n is the number of recesses 5a. The ratio S/S0 of the total area of the openings of all the recesses 5a to the flat surface area may be 0.1 to 0.6, where S0 is the surface area when the surface of the light absorbing member 5 is flat.

This structure allows stray light reaching the light absorbing member 5 to more easily enter the recesses 5a. Thus, the light absorbing member 5 is suitable for practical use. When having the openings with the ratio greater than 0.6, the light absorbing member 5 is thin between the recesses 5a and have lower mechanical strength in this area. The light absorbing member 5 may have more cracks due to thermal stress.

The diameter D1 of each circular opening may satisfy D1≥H1×2, where H1 is the depth of each recess 5a. For example, when the opening diameter D1 of each recess 5a is 0.2 mm, the depth H1 is less than 0.1 mm. When the opening diameter is 1 mm, the depth H1 is less than 0.5 mm. This structure allows stray light reaching the light absorbing member 5 to more easily enter the recesses 5a. Such recesses 5a can also be processed more easily.

As shown in FIG. 4A, the recesses 5a arranged in a rectangular grid have a lateral length, or a pitch P1, of 0.3 to 2 mm, and a lateral length, or a pitch P2, of 0.3 to 2 mm. The pitch P1 is a center-to-center distance of the adjacent recesses 5a in the lateral direction. The pitch P2 is a center-to-center distance of the adjacent recesses 5a in the longitudinal direction. Although either the pitch P1 or the pitch P2 may be greater than the other, the circular recesses 5a as shown in FIG. 4A may be densely arranged in a square grid with the pitch P1 being equal to the pitch P2.

As shown in FIG. 4B, the recesses 5a arranged in a diamond grid have the length of the sides of each diamond in the diamond grid, or in other words, pitches P3 and P4 in the oblique directions of the recesses 5a, may be, for example, 0.3 to 2 mm, and 0.3 to 2 mm. Although either the pitch P3 or the pitch P4 may be greater than the other, the recesses 5a may be arranged in a diamond grid with the pitch P3 being equal to the pitch P4. As described above, this structure can prevent thermal stress from being unevenly applied or concentrating on part of the absorbing member body 50 and the recesses 5a.

One method for preparing the light absorbing member 5 will now be described. In this example, the absorbing member body 50 is glass, and the light absorber 51 is black inorganic pigment powder. Raw material powder containing the above materials, or the glass powder and the black inorganic pigment powder, an organic solvent and a binder are mixed to prepare a mixture paste. This mixture paste is printed by a printing method on the inner surface 4a of the lid 4, which is prepared in advance, to form a layered pattern. Using a mold having protrusions arranged in a rectangular grid or a rhombic grid, recesses are formed in the printed layered pattern. The lid 4 with the recesses formed on the printed pattern is fired at about 800 to 1000° C. to allow the black inorganic pigments to be dispersed in the glass to obtain the light absorbing member 5 with the recesses 5a. The recesses 5a may also be formed by stamping the mold while the glass is softening.

Another embodiment of the present invention will now be described. The present embodiment differs from the embodiment described above in the shapes of the lid 4A and the light absorbing member 5A. Thus, the lid 4A and the light absorbing member 5A will be described, and the other components will not be described.

Figure 5:
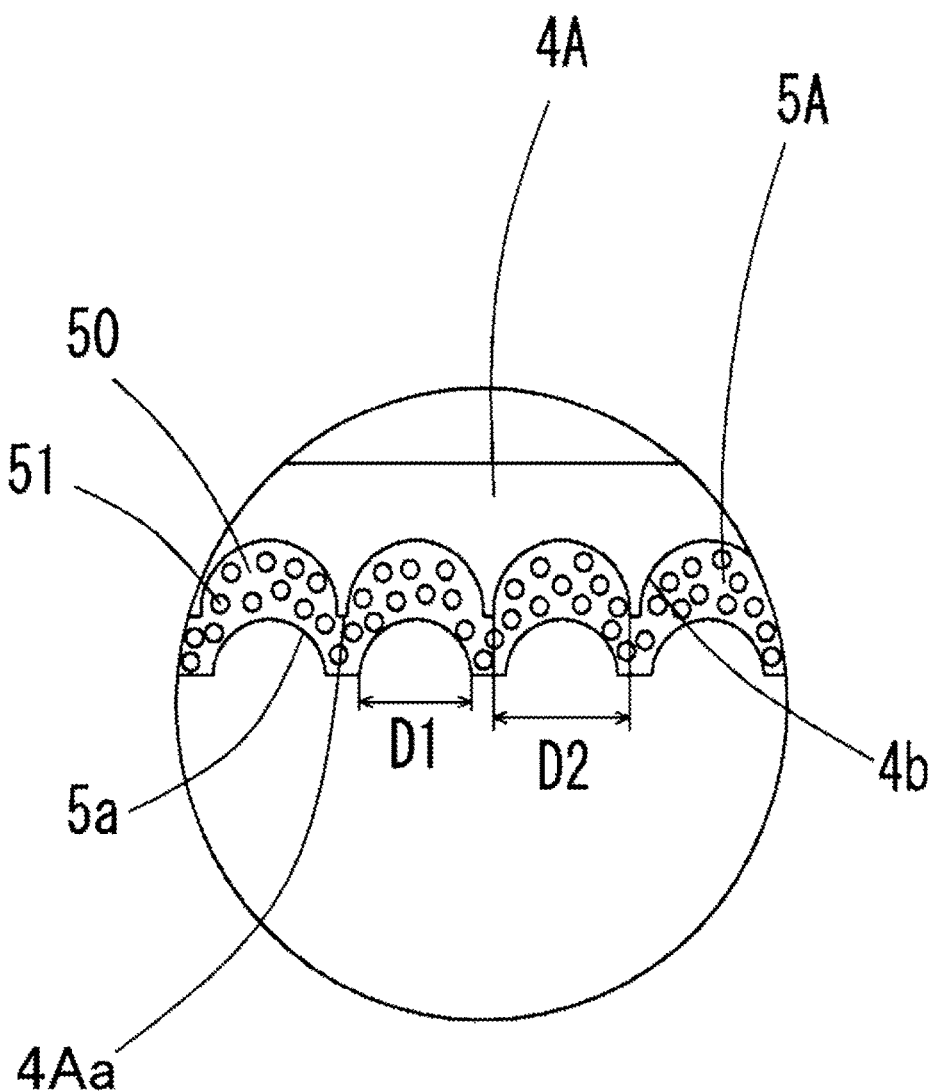
FIG. 5 is a partially enlarged schematic cross-sectional view of a lid 4A and a light absorbing member 5A.

FIG. 5 is a partially enlarged schematic cross-sectional view of the lid 4A and the light absorbing member 5A. Lid surface recesses 4b are arranged on the inner surface 4Aa of the lid 4A facing the light absorbing member 5A, or a surface of the lid 4A facing the mount area 2b (the second surface) and facing the light absorbing member 5A. The recesses 5a are arranged on the surface of the light absorbing member 5A in the same manner as in the above embodiment. The light absorbing member 5A includes the absorbing member body 50 and the light absorbers 51 dispersed in the absorbing member body 50 in the same manner as in the above embodiment.

In the present embodiment, when the lid 4A is viewed from a position perpendicular to the inner surface 4Aa, the recesses 5a on the light absorbing member 5A and the lid surface recesses 4b on the lid 4A are located in correspondence with each other, or in other words, the corresponding recesses are aligned with each other.

In the embodiment shown in FIG. 3, the inner surface 4a of the lid 4 is flat. The light absorbing member 5 thus has a smaller thickness in its portion including the recesses 5a, and a greater thickness in its portion including no recesses 5a. The light absorbing member 5 thus has uneven thicknesses. The portion with the smaller thickness contains less light absorber 51, and thus may insufficiently absorb stray light traveling inside the light absorbing member 5, and may allow stray light to be reflected on the inner surface 4a of the lid 4 and emitted again from the surface of the light absorbing member 5 into the optical semiconductor device 10.

In the present embodiment, the lid surface recesses 4b are arranged on the lid 4A in correspondence with the recesses 5a. Thus, the light absorbing member 5A has a uniform thickness without any portion having a smaller thickness. This light absorbing member 5A can uniformly absorb light in its portion with the recesses 5a. The light absorbing member 5A is also less likely to delaminate under stress applied in the shearing direction along the inner surface 4Aa.

The light absorbing member 5 may have a greater thickness in its portion with the lid surface recesses 4b than its portion with no lid surface recesses 4b. This allows stray light entering the light absorbing member 5 or stray light reflected on the inner surfaces of the lid surface recesses 4b to be easily absorbed by the light absorbers 51 arranged inside the lid surface recesses 4b. Further, when part of stray light entering the light absorbing member 5A reaches the inner surfaces of the lid surface recesses 4b, the stray light repeatedly reflected on the inner surfaces of the lid surface recesses 4b. Thus, the stray light is highly likely to be attenuated by the light absorbers 51 within the lid surface recesses 4b. In this manner, the optical semiconductor device 10 according to the present embodiment prevents stray light traveling in the light absorbing member 5A from being emitted into the optical semiconductor device 10, and allows stray light to be readily absorbed by the light absorber 51.

Figure 6A:
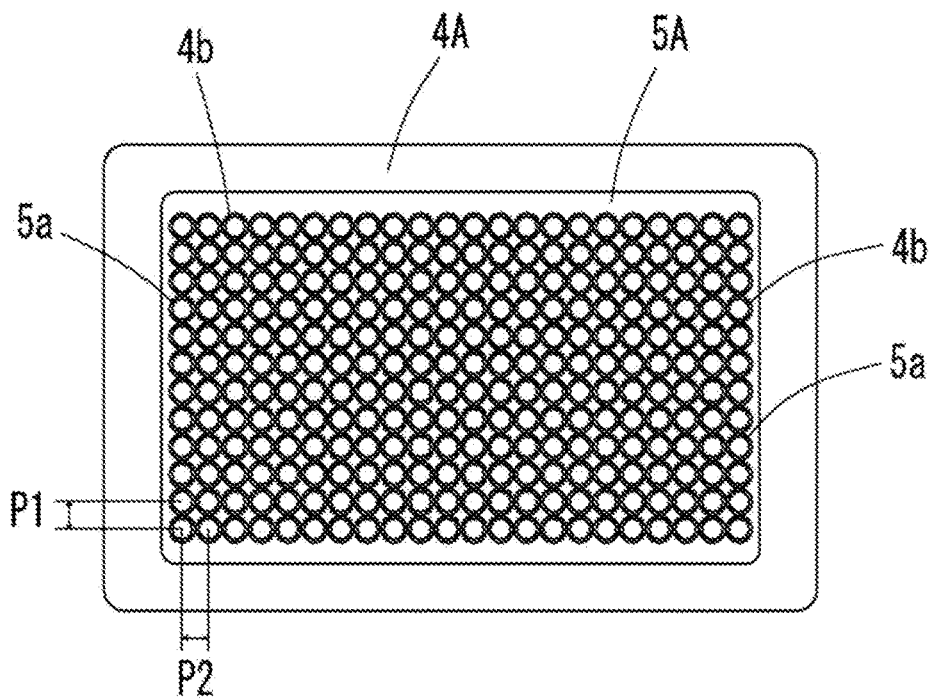
FIGS. 6A and 6B are plan views of the light absorbing member 5A describing the arrays of recesses 5a on its surface.
Figure 6B:
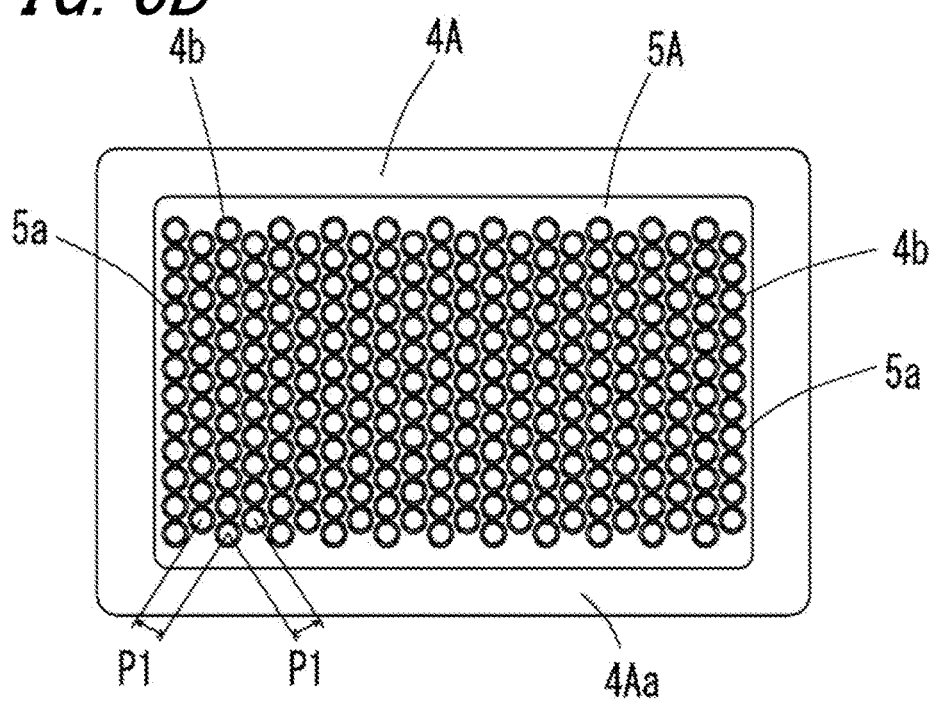

FIGS. 6A and 6B are plan views of the light absorbing member 5A describing the arrays of recesses 5a on its surface. FIG. 6A shows recesses 5a arranged in a rectangular grid. FIG. 6B shows recesses 5a arranged in a rhombic grid. The pitches P1 and P2 for the recesses 5a may be determined in the same manner as described above in the embodiments shown in FIGS. 4A and 4B.

The recesses 5a are arranged in the same manner as in the embodiment described with reference to FIGS. 4A and 4B. For example, the recesses 5a are arranged in a rectangular grid or a rhombic grid. The recesses 5a with circular openings have a diameter D1 of, for example, 0.2 to 1 mm. The pitches P1 and P2 are also 0.3 to 2 mm as in the embodiment above. The diameter D2 of the lid surface recesses 4b on the lid 4A is equal to or slightly greater than the diameter D1, and is, for example, 0.2 to 1.2 mm.

The diameter D2 of the lid surface recesses 4b may be written as D1≥H2×2, where H2 is the depth of the lid surface recesses 4b. For example, the depth H2 of the lid surface recesses 4b may be 0.1 to 0.6 mm.

One method for preparing the light absorbing member 5A having the recesses 5a at the positions corresponding to the lid surface recesses 4b will now be described. In this example, the absorbing member body 50 is formed from glass, and the light absorbers 51 are formed from black inorganic pigment powder. The lid surface recesses 4b are formed on the inner surface 4Aa of the lid 4A using a mold with protrusions arranged in a rectangular grid or a rhombic grid. Raw material powder containing the materials, or the glass powder and the black inorganic pigment powder, an organic solvent, and a binder are mixed to prepare a mixture paste. The mixture paste is printed by the printing method on the inner surface 4Aa of the lid 4A with the lid surface recesses 4b to form a layered pattern. This forms recesses on the layered pattern at the positions corresponding to the lid surface recesses 4b. The resultant layered pattern-printed lid 4 is fired at about 800 to 1000° C. to disperse the black inorganic pigments in the glass. This completes the light absorbing member 5A with the recesses 5a.

Although the optical semiconductor device 10 includes a light-emitting element as the optical semiconductor component 11, the optical semiconductor device according to the present invention may include a photodiode (PD), which is a light-receiving element, as the optical semiconductor component 11. When the light-receiving element is used as the optical semiconductor component 11, the optical semiconductor component package 1 also includes an optical member 12, such as an optical lens, for collecting light emitted from the optical fiber fixed at the through-hole 30a in the frame body 30 and causing the light to enter the light-receiving element. The light-receiving element 13 serving as a monitor is eliminated.

The light-receiving element serving as the optical semiconductor component 11 receives light emitted from the optical fiber, and outputs electric signals in accordance with the amount of light received. The electric signals are output through the wiring board 14, the electrical connection member, and the connection terminals 32. An external controller performs processing in response to the electric signals output from the optical semiconductor device.

Instead of the entire light emitted from the optical fiber passing through the optical member 12 and entering the light-receiving element, the light may be partially reflected on the surface of the optical member 12, or the light passing through the optical member 12 may not partially enter the light-receiving element but may be reflected on the light receiving member. The reflected light may partially be reflected on the surface of the wiring board 14, and may become stray light in the optical semiconductor component package 1. The stray light is reflected on the inner surfaces of the frame body 30, the inner surface of the lid 4 or 4A, and the first surface 2a of the base 2. The reflected light may partially enter the light-receiving element serving as the optical semiconductor component 11, and may then be superimposed as noise to the electric signals to be output from the light-receiving element.

As described above, the light absorbing member 5 with the recesses 5a on the inner surface 4a or 4Aa of the lid 4 or 4A absorbs stray light traveling toward the lid 4 or 4A. This structure reduces light unintendedly received by the light-receiving element, and stabilizes the output from the optical semiconductor device including the light-receiving element as the optical semiconductor component 11.

Although the light absorbing member 5 or 5A is arranged on the inner surface 4a or 4Aa of the lid 4 or 4A, a portion of the lid 4 or 4A, for example, a center portion of the lid 4 or 4A excluding the peripheral portion bonded to the frame body 30 may function as the light absorbing member 5.

REFERENCE SIGNS LIST 1 optical semiconductor component package
2 base
2b mount area
3 frame
4, 4A lid
4a, 4A inner surface
4b lid surface recess
5, 5A light absorbing member
5a recess
10 optical semiconductor device
11 optical semiconductor component
12 optical member
13 light-receiving element
14 wiring board
15 mount member
30 frame body
30a through-hole
31 dielectric layer
32 connection terminal
50 absorbing member body
51 light absorber

The invention claimed is:
1. An optical semiconductor component package, comprising:
   a plate-like base having a first surface including a mount area in which an optical semiconductor component is mountable;
   a frame located on the first surface and surrounding the mount area;
   a plate-like lid bonded to the frame and covering the mount area; and
   a light absorbing member located on a second surface of the lid facing the mount area, the light absorbing member having a plurality of recesses on a surface thereof.
2. The optical semiconductor component package according to claim 1, wherein
   the light absorbing member contains glass and a black inorganic pigment dispersed in the glass.
3. The optical semiconductor component package according to claim 2, wherein
   the plurality of recesses each have a circular opening.
4. The optical semiconductor component package according to claim 2, wherein
   the plurality of recesses are arranged in a rectangular grid or a rhombic grid.
5. The optical semiconductor component package according to claim 2, wherein
   the lid has a plurality of lid surface recesses on a surface thereof facing the mount area.
6. The optical semiconductor component package according to claim 1, wherein
   the plurality of recesses each have a circular opening.
7. The optical semiconductor component package according to claim 6, wherein
   the plurality of recesses are arranged in a rectangular grid or a rhombic grid.
8. The optical semiconductor component package according to claim 1, wherein
   the plurality of recesses are arranged in a rectangular grid or a rhombic grid.
9. The optical semiconductor component package according to claim 8, wherein
   the lid has a plurality of lid surface recesses on a surface thereof facing the mount area.
10. The optical semiconductor component package according to claim 1, wherein
   the lid has a plurality of lid surface recesses on a surface thereof facing the mount area.

11. The optical semiconductor component package according to claim 10, wherein
when the lid is viewed from a position perpendicular to the second surface, the plurality of recesses on the light absorbing member and the plurality of lid surface recesses on the lid are located in correspondence with each other.

12. An optical semiconductor device, comprising:
the optical semiconductor component package according to claim 1; and
an optical semiconductor component mounted in the mount area.

* * * * *